United States Patent [19]

Schoernig et al.

[11] Patent Number: 4,737,811
[45] Date of Patent: Apr. 12, 1988

[54] DEVELOPING STATION OF A PROCESSING SYSTEM FOR PRINTING PLATES

[75] Inventors: Eberhard Schoernig, Taunusstein; Eckehard Stein, Frankfurt, both of Fed. Rep. of Germany; Ullrich Düdder, Hvidovre, Denmark

[73] Assignees: Hoechst Aktiengesellschaft, Frankfurt am Main, Fed. Rep. of Germany; AJAX International Machinery and Metal Works A/S, Ballerup, Denmark

[21] Appl. No.: 910,666

[22] Filed: Sep. 23, 1986

[30] Foreign Application Priority Data

Sep. 25, 1985 [DE] Fed. Rep. of Germany ....... 3534099

[51] Int. Cl.⁴ .............................................. G03D 5/00
[52] U.S. Cl. ........................................ 354/317; 15/77
[58] Field of Search ...................... 354/317, 318, 325; 15/77, 100, 102; 118/647

[56] References Cited

U.S. PATENT DOCUMENTS

| | | | |
|---|---|---|---|
| 3,315,583 | 4/1967 | Hunt | 354/317 |
| 3,641,905 | 2/1972 | Adams | 354/317 |
| 4,073,266 | 2/1978 | Arneth et al. | 118/647 |
| 4,294,533 | 10/1981 | Bratt et al. | 354/325 |
| 4,334,758 | 6/1982 | Leveille | 354/325 |
| 4,464,035 | 8/1984 | Schoering | 354/325 |

FOREIGN PATENT DOCUMENTS

| | | |
|---|---|---|
| 335839 | 12/1977 | Austria . |
| 2331253 | 1/1974 | Fed. Rep. of Germany . |
| 1256719 | 12/1971 | United Kingdom . |
| 2115180 | 9/1983 | United Kingdom . |

Primary Examiner—A. A. Mathews
Attorney, Agent, or Firm—Schwartz, Jeffery, Schwaab, Mack, Blumenthal & Evans

[57] ABSTRACT

In the developing station of a processing system for printing plates, a counter-roller is offset with respect to the brush roller in the plane of passage of the printing plates by a given distance "a". In another embodiment, the transport rollers are lowered by an amount "b" with respect to the plane of passage which extends horizontally between the gap between the brush roller and the counter-roller.

12 Claims, 1 Drawing Sheet

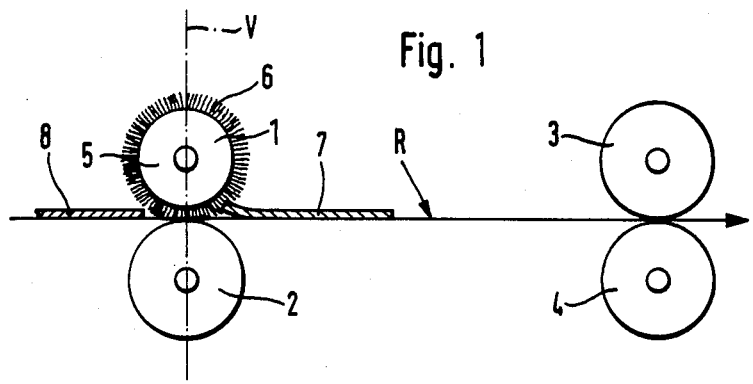
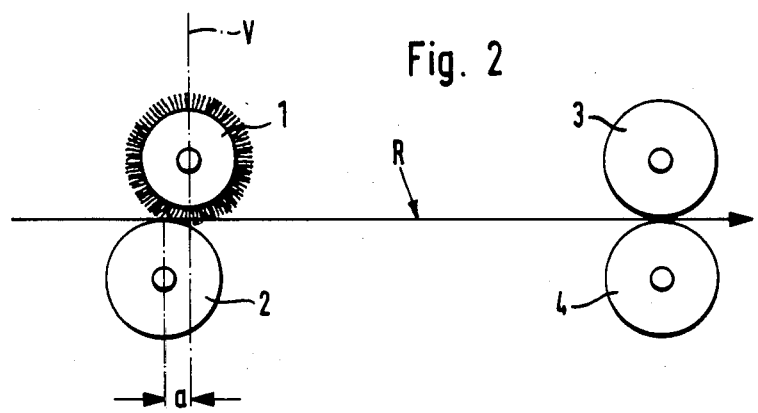
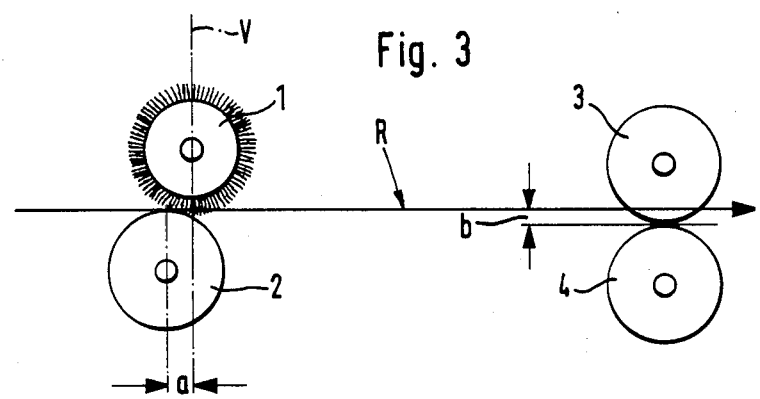

DEVELOPING STATION OF A PROCESSING SYSTEM FOR PRINTING PLATES

BACKGROUND OF THE INVENTION

The invention relates to a developing station of a processing system for printing plates, with at least one rubbing element and one counter-roller, as well as transport rollers arranged downstream of the rubbing element in the direction of passage of the printing plates.

Printing plate processing systems, in particular for negatively working printing plates, have in the developing stations rubbing elements which mechanically aid the detachment of the coating portions of the printing plate which have not been hardened by developing. The use of rubbing elements makes possible a substantial increase in the speed at which the printing plates pass through the processing system.

German Auslegeschrift No. 2,507,221 discloses a developing apparatus for printing plates which has a pair of run-in rollers for the application of a toner dispersion onto the charge image on the printing plate. Additionally, the developing apparatus has a distributor roller that evenly distributes the toner dispersion on the charge image. The distributor roller has a core of metal and a surface consisting of soft, porous, electrically non-conductive material. This soft surface is in contact with the printing plate during the printing plate passage through the developing zone. Furthermore, there is a pair of squeeze rollers for the removal of the unused toner dispersion, which is collected in a catch tray and returned to the pair of run-in rollers.

German Offenlegungsschrift No. 2,331,253 discloses a developing apparatus for electrophotographic copying materials which are passed under application rollers in a developing zone. The application rollers are wetted from above with a toner dispersion. At the end of the developing zone there is a pair of squeeze rollers which removes the excess toner dispersion from the surface of the copying material by squeezing.

The rubbing elements which are used in practice in all developing stations for printing plates are predominatly brush or plush rollers which consist of a metal core with a corresponding bristle or plush covering. Instead of brush rollers, rubbing elements in the form of beams which are moved to and fro in a transverse direction to the passing printing plate and which have a rubbing surface that is covered with plush and/or bristles may also be used. The drive of the rubbing elements is thus either performed rotationally, as in the case of brush rollers which can also execute a to and fro movement, or oscillatingly, as in the case of rubbing beams.

Owing to the relatively simple construction and simple adjustment, in practice rotating rubbing elements, i.e., brush rollers, are usually used. The brush rollers in this case run in the direction of plate passage thereby preventing a plate jam at the brush rollers which is a particular problem with printing plates of small thickness. This problem is unavoidable when the brush rollers rotate counter to the direction of plate passage.

Opposite the rubbing element is either a counter-roller or a deflector in the form of a table structure which functions as abutment for the printing plate. The gap between the rubbing element and the abutment can then generally be fixed by vertical adjustment of the rubbing element.

In the case of the known developing stations, the plane of passage of the printing plate runs horizontal from the gap between the brush roller and its abutment through the gap of the pair of transport rollers or the gaps of the pairs of transport rollers. The transport rollers are arranged at the end of the developing station and transport the developed printing plate into a further processing station.

In the case of both types of abutment for the brush roller, whether it is a counter-roller or a guide baffle in table form as the supporting area for the printing plate, a flipping up of the trailing plate edge occurs when the plate has passed the rubbing element. In particular with small plate thicknesses, this flipping up frequently results in deformation and thus unsuitability of the printing plate. This effect is promoted by the combined effects of high bristle stiffness of the brush covering, high brush roller rotational speed and increasing contact pressure of the rubbing element.

In practice, the attempt to eliminate this effect results in compromise solutions between the individual parameters, such as bristle stiffness and brush roller rotational speed, as well as contact pressure of the brush roller, or in the installation of special holddown devices which substantially minimize a flipping up of the trailing plate edge. For the complete avoidance of flipping up of the trailing plate edge, processing systems with reversible brush/plush rollers are being used ever more increasingly. However, the reversing operation of these rubbing elements has a serious deficiency, as such processing systems cannot be charged continuously with printing plates. To be able to introduce a further printing plate into such a processing system, in each case the previously fed printing plate must have passed the rubbing element or elements and the rotational direction of the rubbing elements have changed, as otherwise a plate jam would occur, at the first rubbing element. This results in considerable idle time in continuous processing of the printing plates and consequent reduction in the printing plate throughput of the processing system.

SUMMARY OF THE INVENTION

It is therefore an object of the present invention to improve a developing station of a processing system for printing plates of the type previously described in such a way that a flipping up of the trailing edge of the printing plate after passing the rubbing element or the rubbing elements is substantially avoided.

It is also an object to improve a developing station of a processing system for printing plates in such a way as to prevent plate jam at the brush rollers.

Another object is to minimize the flipping up of the trailing plate edge without the need for adjusting bristle stiffness, brush roller rotational speed and contact pressure of the rubbing element.

It is a further object to minimize the following up of the trailing plate edge without the need for reversible brush/plush rollers.

Another object of the present invention is to provide a developing station of a processing system for printing plates in which the transport rollers are not in horizontal line with the rubbing element and counter-roller and the rubbing element is offset with respect to the counter-roller by a distance in the direction of passage of the printing plates.

Yet another object is to ensure that the printing plates are not subjected to any additional mechanical oscillations during transport and thus the developed charge image is not damaged by mechanical effects.

In accordance with one aspect of the present invention, these objects are achieved by a developing station of a processing system for printing plates, the station having an upstream and a downstream direction along a plane of passage of printing plates having a leading edge and a trailing edge, comprising at least one rubbing element, at least one counter-roller adjacent to the rubbing element, a plurality of transport rollers located downstream of the rubbing element, and means for suppressing flipping up of the trailing plate edge including offsetting the rubbing element with respect to the counter-roller in the plane of passage by a distance in the direction of passage.

These objects are achieved by the rubbing element being offset with respect to the counter-roller in the plane of passage of the printing plates by a given distance "a" in the direction of passage.

In an embodiment of the invention, the plane of passage extends horizontally through the gap between the rubbing element and the counter-roller and through the gap between the transport rollers. The rubbing element is expediently a brush roller, the centers of the brush roller and of the counter-roller being offset with respect to each other in the horizontal direction by the distance "a", and the brush roller and the counter-roller touch each other.

In yet another embodiment of the invention, the distance "a" is between about 2 and 8 millimeters, depending on the plate thickness of the printing plates to be processed.

In another embodiment according to the invention, the brush roller has an external diameter of about 70 millimeters, and a free bristle length of about 10 millimeters; the counter-roller has an external diameter of about 60 millimeters; and the rubbing element is offset with respect to the counter-roller a distance of about 4 millimeters.

In a further embodiment of the invention, the transport rollers are vertically lowered with respect to the plane of passage which extends horizontally between the rubbing element and the counter-roller. In this case, the lowering "b" of the transport rollers is between about 2 and 4 millimeters.

These objects are also achieved by a process for preventing the flipping up of a trailing plate edge of a printing plate comprising the steps of: (a) providing a developing station of a processing system for printing plates, the station having an upstream and a downstream direction along a plane of passage of printing plates having a leading edge and a trailing edge, (b) providing at least one rubbing element, (c) providing at least one counter-roller adjacent to the rubbing element, (d) providing a plurality of transport rollers located downstream of the rubbing element, and (e) offsetting the rubbing element with respect to the counter-roller in the plane of passage by a distance in the direction of passage such that during the processing of a printing plate the flipping up of the trailing plate edge of the printing plate is prevented.

BRIEF DESCRIPTION OF THE DRAWINGS

The invention is described in more detail with reference to schematic drawings of the arrangement of rubbing element, counter-roller and transport rollers relative to one another, wherein:

FIG. 1 shows, in schematic sideview, the arrangement of brush roller, counter-roller and transport rollers in the prior art;

FIG. 2 shows, in schematic sideview, the arrangement of brush roller, counter-roller and transport rollers according to a preferred embodiment of the invention; and FIG. 3 shows, in schematic sideview, the arrangement of brush roller, counter-roller and transport rollers according to another embodiment of the invention.

DETAILED DESCRIPTION OF THE PREFERRED EMBODIMENTS

In FIG. 1, the prior art of a developing station is schematically represented, which includes a brush roller 1 and a counter-roller 2, as well as one or more pairs of transport rollers, of which one pair of transport rollers is represented by the rollers 3 and 4. Instead of a brush roller, a plush roller may also be used as rubbing element. The counter-roller 2 which serves as abutment to the brush roller 1, is generally a steel roller. The brush roller 1 consists of a metal or steel core 5, on the circumferential surface of which are arranged the bristles 6, which in their totality form the brush surface of the brush roller. A plane of passage R runs horizontally through the gap between the brush roller 1 and the counter-roller 2 as well as the gap between the transport rollers 3 and 4. The centers of the brush roller 1 and of the counter-roller 2 lie on a common vertical joining line V, which forms a right-angle with a plane of passage R. In FIG. 1, a printing plate 7 is shown which has just passed the brush roller 1 and the counter-roller 2 and the trailing edge of which flips up. A further printing plate 8 is fed to the gap between the brush roller 1 and the counter-roller 2. Instead of the counter-roller 2, a horizontally running deflector, not shown, may also be provided as abutment to the brush roller 1. The brush roller 1 is displaceable in the vertical direction within short distances, to be able thereby to set the gap width between the brush roller 1 and the abutment according to the plate thickness.

In FIG. 2, an arrangement of brush roller 1, counter-roller 2 and transport rollers 3 and 4 is represented, similar to the arrangement according to FIG. 1, with the difference that the centers of the brush roller 1 and of the counter-roller 2 are offset with respect to each other by a distance "a" in the horizontal direction. In this case it is found, surprisingly, that the flipping up of the trailing edge of the printing plate is avoided with great certainty. The brush roller 1 and the counter-roller 2 touch in this arrangement. There is no common vertical joining line of the centers of the brush roller 1 and of the counter-roller 2. The position of the counter-roller 2 is advanced with respect to the brush roller 1 by the distance "a" in the direction of plate run-in. In a specific embodiment of the invention, the external diameter of the brush roller is about 70 millimeters, the free bristle length of the brush roller is about 10 millimeters and the external diameter of the counter-roller is about 60 millimeters. The distance "a" can be within a range from about 2 to 8 millimeters, in particular a distance "a" of about 4 millimeters is preferred.

The distance "a" is to be classed as a variable, which is determined by the geometric dimensions of the brush roller 1 and of the counter-roller 2. By such an arrangement, the flipping up of the trailing plate edge is completely suppressed for printing plate thicknesses between about 0.1 and 0.5 millimeter.

The positive effect from the offset of the counter-roller 2 with respect to the brush roller 1 for the passage of the printing plates, which now can be further conveyed by the transport rollers very evenly and steadily, since a flipping up of the trailing printing plate edge does not occur, is attributable to the earlier release of the trailing plate edge by the brush roller 1 in comparison with the known arrangement according to FIG. 1. The earlier release of the trailing plate edge results in a premature dropping of the trailing edge from the area of influence of the brush roller 1 owing to the weight of the printing plate and of the developer weight. The latter can be particularly apparent in the case of small plate thicknesses. To be regarded as a further influencing parameter is the change in the moment of engagement of the brush roller 1 and of the counter-roller 2 with the trailing edge of the printing plate, compared with the prior art.

In the case of the further embodiment of the invention shown in FIG. 3, the transport rollers 3 and 4 are vertically lowered with respect to the plane of passage R, which extends horizontally between the brush roller 1 and the counter-roller 2. This means that the run-in gap of the transport rollers 3 and 4, which are located downstream of the brush roller 1 and of the counter-roller 2, lies below the level of the plane of passage R. The lowering "b" of the transport rollers 3 and 4 can be a distance of between about 2 to 4 millimeters. The lowering "b" depends on the distance between the brush roller 1 and the transport rollers 3 and 4.

The larger this distance, the larger also the lowering of the transport rollers 3 and 4 is chosen.

With the developing stations schematically represented in FIGS. 2 and 3, a safe processing of printing plates, with substantial avoidance of a flipping up of the trailing edges of the printing plates, is possible.

This ensures that the printing plates are not subjected to any additional mechanical oscillations during transport and thus the developed charge image is not damaged by mechanical effects. Of advantage in the case of the invention is that the flipping up of the trailing edges of the printing plates is avoided by very simple structural measures, such as the offsetting of the counter-roller with respect to the brush roller and the lowering of the transport rollers with respect to the plane of passage of the printing plates.

In the drawings, the distance "a" and the lowering "b" are enlarged compared with the roller diameters provided in practice.

What is claimed is:

1. A developing station of a processing system for printing plates, the station having an upstream and a downstream direction along which printing plates having a leading edge and a trailing edge are passed, comprising:
   (a) means for detaching unhardened coating portions which adhere to the printing plates during a prior developing process, the means including at least one rubbing element,
   (b) at least one counter-roller positioned adjacent to the rubbing element, the counter roller and the rubbing element defining a first plane of passage passing horizontally therebetween,
   (c) a plurality of transport rollers located downstream of the rubbing element, a pair of the plurality of transport rollers being positioned adjacent one another so as to define a run-in gap, the run-in gap being below the first plane of passage, and
   (d) means for suppressing flipping up of the trailing plate edge including offsetting the rubbing element downstream with respect to the counter-roller, by a distance in the direction of passage.

2. The developing station of a processing system for printing plates as claimed in claim 1, wherein a second plane of passage extends between the rubbing element and the counter-roller and through the run-in gap between the pair of transport rollers and is slightly inclined from the first plane of passage.

3. The developing station of a processing system for printing plates as claimed in claim 1, wherein the rubbing element is a brush roller, wherein the centers of the brush roller and of the counter-roller are offset with respect to each other by a distance in the direction of passage and wherein the brush roller and the counter-roller touch.

4. The developing station of a processing system for printing plates as claimed in claim 3, wherein the rubbing element is offset with respect to the counter-roller a distance of between about 2 and 8 millimeters.

5. The developing station of a processing system for printing plates as claimed in claim 4, wherein the brush roller has an external diameter of about 70 millimeters and a free bristle length of about 10 millimeters, the counter-roller has an external diameter of about 60 millimeters, and the rubbing element is offset with respect to the counter-roller a distance of about 4 millimeters.

6. The developing station of a processing system for printing plates as claimed in claim 1, wherein the run-in gap between the pair of transport rollers is between about 2 to 4 millimeters below the first plane of passage.

7. A process for preventing the flipping up of a trailing plate edge of a printing plate comprising the steps of:
   (a) providing a developing station of a processing system for printing plates, the station having an upstream and a downstream direction along a plane of passage of printing plates having a leading edge and a trailing edge,
   (b) providing at least one rubbing element,
   (c) providing at least one counter-roller adjacent to the rubbing element, the counter-roller and the rubbing element defining a first plane of passage passing horizontally therebetween,
   (d) providing a plurality of transport rollers located downstream of the rubbing element, a pair of the plurality of transport rollers being positioned adjacent one another so as to define a run-in gap, the run-in gap being below the first plane of passage, and
   (e) offsetting the rubbing element downstream with respect to the counter-roller by a distance in the direction of passage such that during the processing of a printing plate the flipping up of the trailing plate edge of the printing plate is prevented.

8. The process of claim 7, wherein a second plane of passage extends between the rubbing element and the counter-roller and through the run-in gap between the pair of transport rollers and is slightly inclined from the first plane of passage.

9. The process of claim 7, wherein the rubbing element is a brush roller, wherein the centers of the brush roller and of the counter-roller are offset with respect to each other by a distance in the direction of passage and wherein the brush roller and the counter-roller touch.

10. The process of claim 9, wherein the rubbing element is offset with respect to the counter-roller a distance of between about 2 and 8 millimeters.

11. The process of claim 10, wherein the brush roller has an external diameter of about 70 millimeters and a free bristle length of about 10 millimeters, the counter-roller has an external diameter of about 60 millimeters, and the rubbing element is offset with respect to the counter-roller a distance of about 4 millimeters.

12. The process of claim 7, wherein the run-in gap between the pair of transport rollers is between about 2 to 4 millimeters below the first plane of passage.

* * * * *